US006576532B1

(12) United States Patent
Jones et al.

(10) Patent No.: US 6,576,532 B1
(45) Date of Patent: Jun. 10, 2003

(54) SEMICONDUCTOR DEVICE AND METHOD THEREFOR

(75) Inventors: Robert E. Jones, Austin, TX (US);
Bruce E. White, Round Rock, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/997,886

(22) Filed: Nov. 30, 2001

(51) Int. Cl.$^7$ ........................... H01L 21/36; H01L 21/20
(52) U.S. Cl. ....................... 438/481; 438/341; 438/478
(58) Field of Search ................................ 438/481, 478, 438/489, 222, 220, 341, 226, 269, 480, 479; 257/190

(56) References Cited

U.S. PATENT DOCUMENTS

| 4,174,422 A | * | 11/1979 | Matthews et al. | ........... 428/621 |
| 6,060,743 A | * | 5/2000 | Sugiyama et al. | ........... 257/321 |
| 6,121,121 A | * | 9/2000 | Koide | ......................... 438/481 |
| 6,407,406 B1 | * | 6/2002 | Tezuka | ........................... 257/18 |

FOREIGN PATENT DOCUMENTS

| JP | 2001185498 A | * | 7/2001 | ........... C23C/16/02 |
| WO | WO 01/01465 A1 | | 1/2001 | |

OTHER PUBLICATIONS

Langdo et al., High Quality Ge on Si by Expitaxial Necking, Applied Physics Letters, V76, N25, pp. 3700–3702, Jun., 2000.*

Luan, "Germanium Photodetectors for Silicon Microphotonics by Direct Epitaxy on Silicon," Mat. Res. Soc. Symp. Proc. vol. 607, 2000 Materials Research Scoiety, pp. 279–284.

Langdo, "High Quality Ge on Si by Epitaxial Necking," Appl. Phys. Lett., vol. 76, No. 25, American Institute of Physics, pp. 3700–3702 (2000).

Colace, "Efficient High–speed Near–infrared Ge Photodetectors Integrated on Si Substrates," Appl. Phys. Lett., vol. 76, No. 10, American Institute of Physics, pp. 1231–1233 (2000).

Samavedam, "High–quality Germanium Photodiodes Integrated on Silicon Substrates Using Optimized Relaxed Graded Buffers," Applied Physics Letters, vol. 73, No. 15, American Institute of Physics, pp. 2125–2127 (1998).

* cited by examiner

*Primary Examiner*—Shouxiang Hu
(74) *Attorney, Agent, or Firm*—James L. Clingan, Jr.; Joanna G. Chiu

(57) ABSTRACT

A heteroepitaxial structure is made using nanocrystals that are formed closer together than normal lithography patterning would allow. The nanocrystals are oxidized and thus selectively etchable with respect to the substrate and surrounding material. In one case the oxidized nanocrystals are removed to expose the substrate at those locations and selective epitaxial germanium is then grown at those exposed substrate locations. The inevitable formation of the misfit dislocations does minimal harm because they are terminated at the surrounding material. In another case the surrounding material is removed and the germanium is epitaxially grown at the exposed substrate where the surrounding material is removed. The resulting misfit dislocations in the germanium terminate at the oxidized nanocrystals. By using nanocrystals that are able to be formed much closer together than is available for other features through lithography, the misfits are prevented from extending so far as to create harmful threading dislocations.

10 Claims, 5 Drawing Sheets

SEMICONDUCTOR DEVICE AND METHOD THEREFOR

BACKGROUND OF THE INVENTION

1. Field of the Invention

This invention relates to techniques for making semiconductor devices and more particularly to forming heteroepitaxial structures.

2. Related Art

There are a variety of uses in semiconductor manufacturing for heteroepitaxial structures, structures in which one type of semiconductor material is grown on the top of another type. The desire is for both the underlying semiconductor material and the overlying semiconductor material to be monocrystalline. The difficulty in this is that often the desired overlying semiconductor material has a mismatch in its crystalline structure with that of the underlying crystalline material. The problem can occur for any situation in which there are two types of semiconductor materials desired for a particular integrated circuit, but currently a typical case is for the underlying semiconductor material to be silicon because that is the most common for making integrated circuits. In the case of optical electronics, it is desirable to use germanium, which is an excellent material for use as a photodetector because of its relatively low band gap. Thus, with silicon being desirable for its use in making transistors for circuits, it would be beneficial to have a germanium layer as well as a silicon layer so that a photodetector useful for near infrared communications wavelengths (1300–1550 nanometers) can be combined with transistor circuitry on the same integrated circuit.

Germanium and silicon, however, have crystalline structures that have a 4 percent mismatch in the lattice constant. The result of epitaxially growing a germanium layer over the silicon substrate is the formation of misfit dislocations. The misfit dislocations in turn cause threading dislocations. The threading dislocations create major problems with leakage and efficiency reduction of the photodetector. Whereas misfit dislocations remain near and parallel to the underlying substrate, threading dislocations propagate through the entire thickness of the epitaxially-grown overlying layer.

One of the techniques that has been used to reduce the number of threading dislocations in the overlying germanium layer is to introduce an intermediate graded buffer layer between the silicon substrate and the germanium layer. The graded buffer is comprised of silicon and germanium with a local composition that can be described as $Si_{1-x}Ge_x$. During the growth of the graded buffer layer the composition starts at x=0 and gradually increases with increasing film thickness until x=1 is achieved. The change in x can either be continuous or it can be accomplished in a stepwise fashion. Following deposition of the graded buffer layer, the desired germanium layer is deposited on top of the buffer layer. This technique has been demonstrated to be able to confine a majority of the threading dislocations in the buffer layer and hence to achieve a substantial decrease in the threading dislocations in the overlying germanium layer. A disadvantage of this technique is that a thick buffer layer is required to achieve the desired decrease in threading dislocations in the overlying germanium layer. Typically the graded buffer layer needs to be approximately 10 microns thick or greater. This results in a long and expensive deposition. Additionally, the great difference in height of the silicon surface and the germanium surface will result in integration difficulties if an integrated circuit is to be fabricated from devices fabricated in the silicon surface and photodetectors in the germanium surface. Because of the disadvantages of the graded buffer technique, there have been efforts to develop alternate techniques that reduce the threading dislocations in the overlying germanium layer but with substantial reduction in thickness of any intermediate layer.

One such technique is to provide high heat to the germanium to heal the threading dislocations. Thermal cycling to a temperature of approximately 900 degrees Celsius or above is used to cause the threading dislocations to glide. Threading dislocations can be removed from the film either by gliding to the edge of the sample or by two threading dislocations gliding together and annihilating. Longer anneal times at 900 degrees Celsius or an increased number of thermal cycles to 900 degrees Celsius have been found to reduce the density of remaining threading dislocations. Additionally, this technique has been used with mesas of germanium with restricted lateral dimensions of typically 10 to 20 microns. The germanium mesas are formed by selective growth of germanium in windows opened in a dielectric layer to expose underlying silicon. The selective germanium deposition nucleates and grows on the exposed silicon surface but not on the dielectric layer. The germanium mesas lie within the opening in the dielectric window. During the post-deposition thermal cycling, which occurs at high temperature, the restricted size of a mesa assists the gliding of threading dislocation to the dielectric layer at the edge of the mesa. This technique has been demonstrated to be beneficial in reducing threading dislocation densities, however the best reported results are not yet as good as those achieved with the graded buffer layer. The thermal cycling technique does have the advantage of achieving a reduced threading dislocation density in a thin layer of germanium. The use of multiple, high temperature thermal cycles, however, adversely affects any transistors that have already been formed in the integrated circuit. The transistors are formed with a certain amount of total heat energy that is a combination of time and temperature. This is generally known as a thermal budget. Thus, the transistors formed in the silicon portion of the integrated circuit, prior to formation of the germanium layer, have substantially used up the available thermal budget. Additional heating steps must be kept at relatively low temperature such as below 600 degrees Celsius or at least for the cases where that temperature is exceeded, it is exceeded for short time periods.

Another technique for growth of germanium on a silicon substrate is epitaxial lateral overgrowth. In this technique, the silicon substrate is covered with an amorphous dielectric layer, (such as silicon oxide or silicon nitride), and then a pattern of openings in the dielectric layer to the underlying silicon is created using lithographic patterning processes. Selective epitaxial germanium deposition nucleates and grows over the exposed silicon regions. In the present process, however, the epitaxial germanium deposition is continued until the germanium overfills the opening in the dielectric and begins to overgrow the upper surface of the dielectric layer. The growth process is continued until the germanium material from adjacent opening meets and a continuous film is formed across the substrate. The germanium grown over the upper surface of the amorphous dielectric layer is free to assume the natural germanium lattice constant. Threading dislocations can still occur in the germanium grown directly over the silicon nucleation regions. Thermal cycling as discussed above could be used to glide the threading dislocations to the sides of the openings in the dielectric layer. Alternatively, since the threading dislocations form at 45 degrees to the silicon surface for germanium grown on (100) silicon, if the height of the opening is greater than the diameter of the opening, then the threading dislocations will terminate on the perimeter of the opening. Another aspect of epitaxial lateral overgrowth is that a seam can occur where the germanium from two adjacent nucleation sites merge. The germanium layers grown with this technique, however, can result in no defects at many seams and in twins or low angle grain boundaries at other seams that have minimal impact on the electrical properties. A disadvantage of this technique is that a thicker germanium layer must be deposited to first fill the holes and then to form the desired layer. Additionally, if the holes and spaces are relatively large, the result is a rough surface that results in the growth of the germanium from the nucleation sites. Both of these effects can be reduced by making the openings and spaces smaller. There are limitations, however, in the scaling that can be achieved with lithographic techniques.

Thus, there is a need for forming heteroepitaxial structures in which the threading dislocations are relatively few and the heat requirements are relatively low and in which needed scaling can be achieved.

DESCRIPTION OF THE INVENTION

In one embodiment a photodetector using heteroepitaxial layers is formed in a portion of an integrated circuit using silicon nanocrystals that are formed relatively close together over a silicon substrate. These nanocrystals are completely oxidized to form insulating islands over the silicon. A subsequent etch back exposes the underlying silicon but leaves the insulating islands as masks for beginning a selective epitaxial growth of germanium over the silicon. The germanium grows and immediately forms misfit dislocations a short distance from the surface of the silicon. These misfit dislocations run a short distance above and parallel to the silicon substrate and are terminated at the insulating islands. The epitaxial growth continues and ultimately comes together at the top of these insulating islands. There may be a grain boundary formed at the top of each insulating island. The insulating islands are close enough together so that the misfit dislocations terminate on these islands prior to forming threading dislocations. This has the benefit, then, of significantly reducing the number of threading dislocations that occur while not significantly impacting the thermal budget of the whole integrated circuit. This and other embodiments are better understood by reference to the drawings and the following description.

Figure 1:
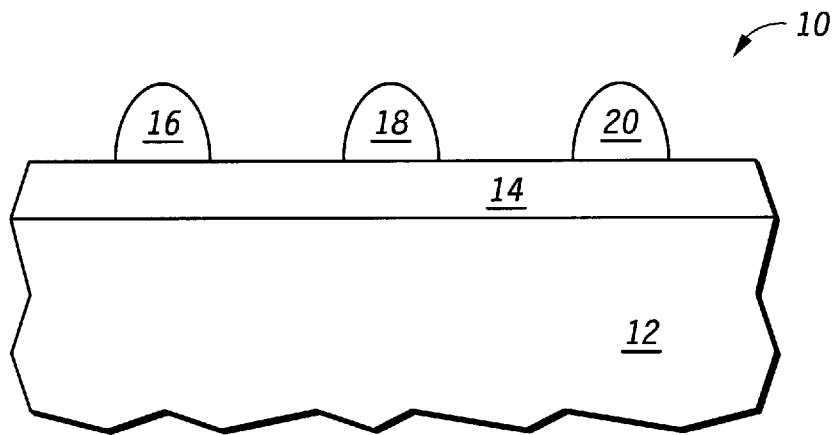
FIG. 1 is a cross section of a device structure at a starting point of a first embodiment of the invention.

Shown in FIG. 1 is a device 10 comprising a substrate 12, a silicon oxide layer 14, a nanocrystal 16, a nanocrystal 18, and a nanocrystal 20. Substrate 12 is a crystalline layer that may overlie an insulating material as in silicon-on-insulator (SOI) substrates. Substrate 12 is monocrystalline silicon but could be a different semiconductor material. Nanocrystals 16, 18, and 20 may be formed in any one of a variety of ways. One well-known way is to deposit an amorphous silicon layer and heat it to form the nanocrystals. Another technique is to deposit the nanocrystals using chemical vapor deposition (CVD). There may be other techniques as well. The hemispherical shape is considered the most desirable but a spherical shape may work just as well. The hemispherical shape can be obtained by choosing an appropriate thickness of amorphous silicon and applying the heat at a temperature and time to achieve the hemispherical shape. The hemispherical shape may also be obtained by appropriate CVD conditions. Desirably the diameter of the nanocrystals is about 100 angstroms and the distance between nanocrystals is also about 100 angstroms. The 100 angstroms is a relatively short distance for a misfit dislocation to travel and should not create a threading dislocation over that distance. The pattern of the nanocrystals is relatively evenly spaced apart by the nature of the processes used to form them.

An important aspect of the techniques for forming the nanocrystals is that they are accomplished by a non-lithographic process. Nanocrystals may be formed in a variety of ways, but the particular way is not significant except that it not require a masking step in which lithography is utilized. Typical formation of a structure in an integrated circuit requires a mask that is patterned by a lithographic step. Thus, the device features are determined by the capability of the particular lithography. Thus, for example, in a 0.1-micron technology the features that can be resolved are in the order of 1000 angstroms. The nanocrystals are much smaller than 1000 angstroms and the distance that they are apart, the distance to the nearest neighboring nanocrystal, is much less than 1000 angstroms. Thus, a significant improvement can be achieved by nanocrystals that are 500 Angstroms or less apart. A distance of 100 Angstroms apart is even a greater improvement. The size and distance apart of the nanocrystals may be optimized at even smaller dimensions.

Nanocrystals 16–20 are formed of silicon as is common in the industry. One typical use of nanocrystals is to act as charge storage devices in a floating gate type non-volatile memory transistor. Thus, a nanocrystal is in this case considered to be a crystalline material of relatively small dimension compared to the lithographic capabilities of the current technological generation and is crystalline and substantially spherical or hemispherical in shape. Thus, device structure 10 of FIG. 1 is known in the prior art but is generally known for its use in the formation of a memory.

Figure 2:
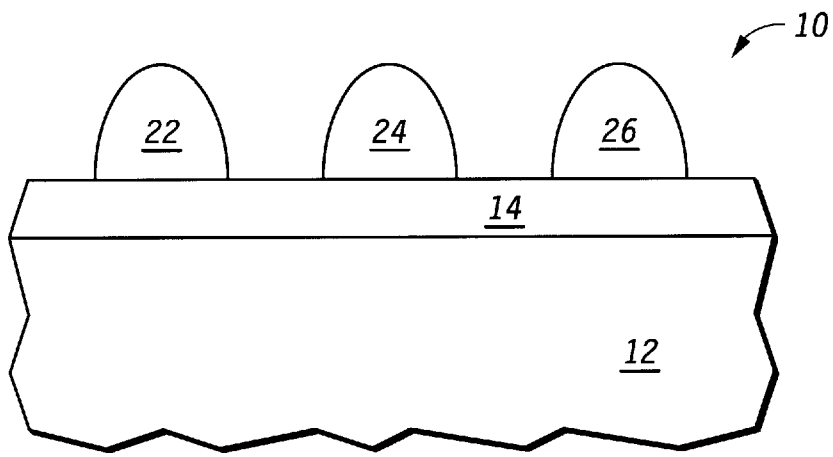
FIGS. 2–4 are cross sections of the device structure at subsequent and sequential steps according to the first embodiment of the invention.
Figure 3:
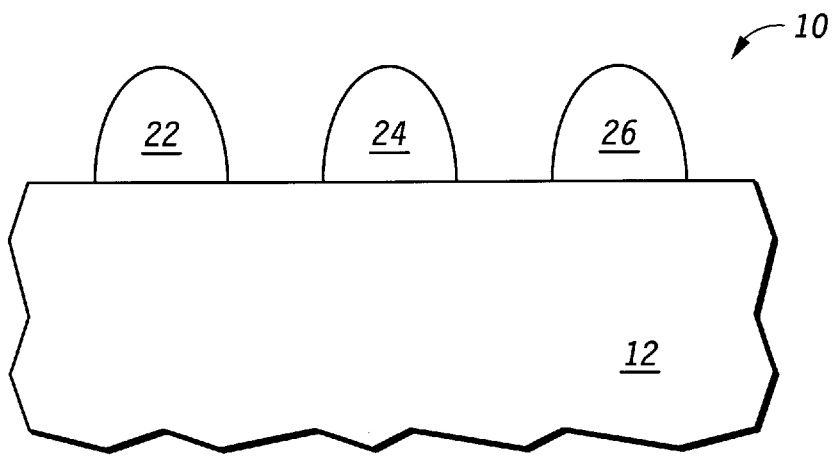

Shown in FIG. 2 is device structure 10 after nanocrystals 16–20 have been oxidized to form nanoscale islands 22, 24, and 26 of silicon oxide. After formation of nanoscale islands 22–26 there is an anisotropic etch back step to remove a portion of silicon oxide layer 14. The result is shown in FIG. 3 with nanoscale islands 22–26 remaining hemispherical in shape and exposed portions of silicon substrate 12 between nanoscale islands 22–26. Thus, these exposed portions of silicon substrate 12 are available for formation of an epitaxial layer on it.

Figure 4:
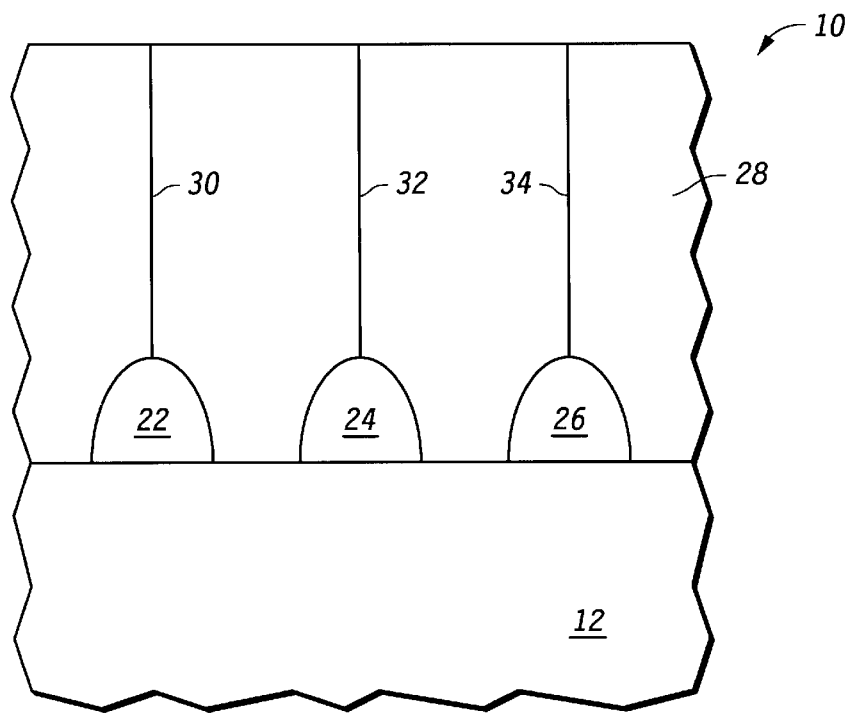

Shown in FIG. 4 is formation of a germanium epitaxial layer 28 over silicon substrate 12. Over nanoscale islands 22–26 are grain boundaries 30, 32, and 34, respectively.

Grain boundaries 30–34 are shown as vertical, but other orientations may result from the growth process. Additionally, as is known in the art, some or many of the grain boundaries may not even form. Germanium layer 28 is formed with a substantially reduced number of threading dislocations because of the misfit dislocations terminating on nanoscale islands 22–26. Although the dislocations can extend laterally in any direction and may not contact the nearest nanoscale island, the extension will not extend far because behind the space between two adjacent nanoscale islands will be another nanoscale island. Thus, a misfit dislocation may extend a little more than the amount the nanoscale islands are apart but not much more than that.

Figure 5:
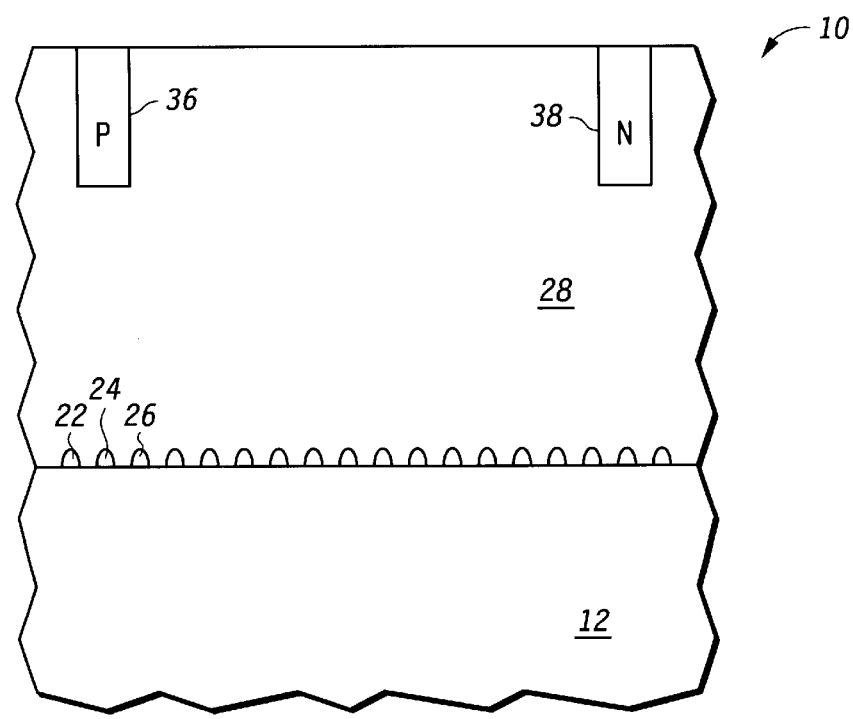
FIG. 5 is a cross section of the device structure of a photo detector according to a first embodiment of the invention.

Shown in FIG. 5 is more of device 10 that shows P-region 36 and an N-region 38 that together operate as a photo detector. A completed photo detector typically would have many more P and N regions such as 36 and 38. The grain boundaries 30–34 would also be present in the additional nanoscale islands shown in FIG. 5. These are not a problem of consequence because the formation of the epitaxial layer around them comes together to form these grain boundaries at an angle with respect to each other that is low. Low angle grain boundaries have much better electrical properties than those that are not at a low angle. The low angle grain boundaries have significantly less scattering effects and fewer dangling bonds. Also many of the noncrystals may not have grain boundaries form over them.

The resulting structure in device 10 is achieved with a relatively small amount of heating and thus does not significantly effect the thermal budget of the entire integrated circuit. The growth of the germanium would be at a temperature below 600 degrees Celsius as would be the anneals of the germanium. The oxidation of the silicon nanocrystals is optimally done using plasma to minimize the temperature. If a temperature above 600 degrees Celsius is used, it would be for short time periods. The temperatures and times involved are minimal compared to the very high temperatures and very long time periods that have been required to anneal out threading dislocations.

Figure 6:
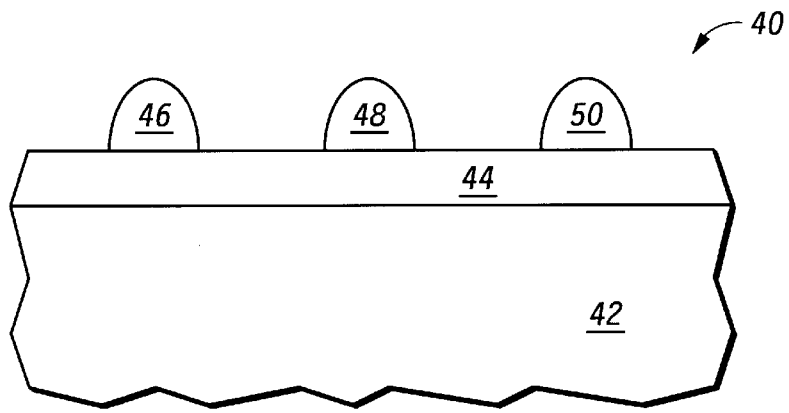
FIG. 6 is a cross section of a second device structure at a starting point for a second embodiment of the present invention.

Shown in FIG. 6 is a device structure 40 comprising a substrate 42, an oxide layer 44, nanocrystal 46, nanocrystal 48, and a nanocrystal 50. Device structure 40 as shown in FIG. 6 is similar to that shown in FIG. 1 as a starting point for an alternate embodiment to that of FIGS. 1–5.

Figure 7:
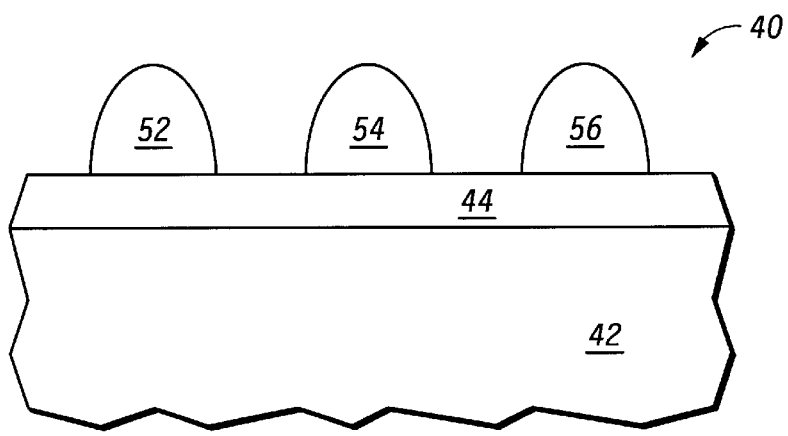
FIGS. 7–11 are cross sections of the device structure of FIG. 6 at subsequent and sequential steps according to the second embodiment of the invention.
Figure 8:
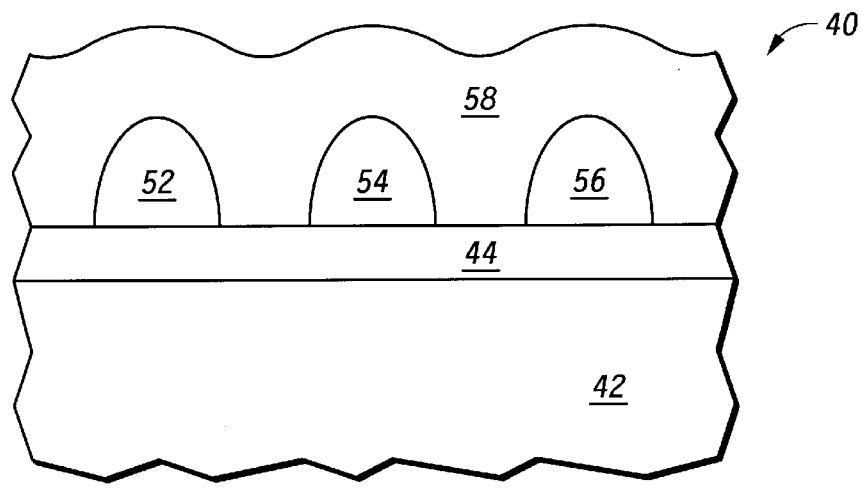

Shown in FIG. 7 is device 10 after an oxidation step resulting in silicon dioxide nanoscale islands 52, 54, and 56 similar to that developed in FIG. 2. Shown in FIG. 8 is device 40 after deposition of a silicon nitride layer 58 over nanoscale islands 52, 54, and 56.

Figure 9:
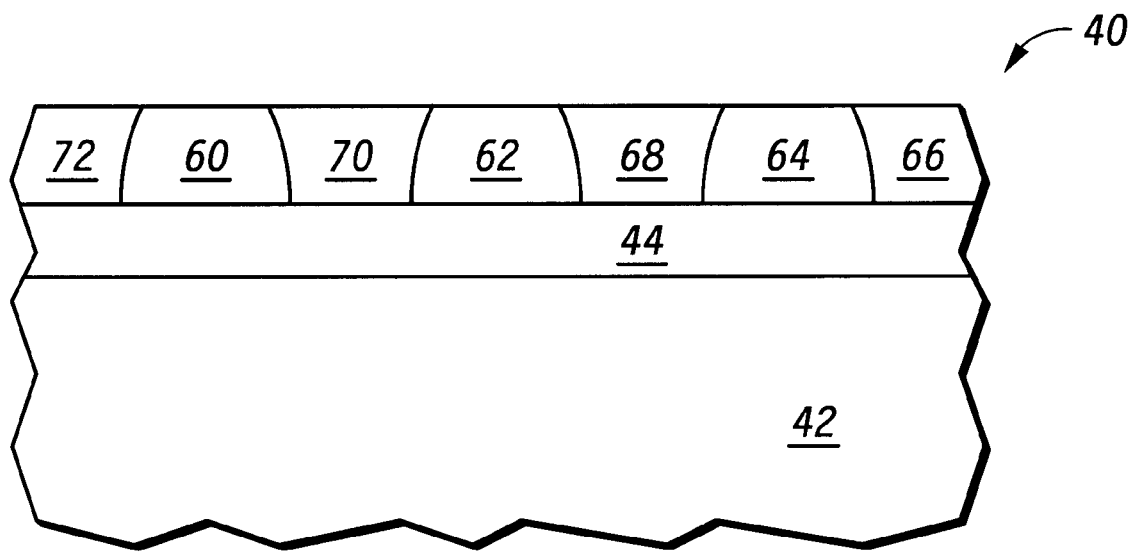

Shown in FIG. 9 is device 40 after a chemical-mechanical polishing (CMP) step in which nitride layer 58 is planarized and etched down to remove portions of nanoscale islands 52, 54, and 56 to form nanoscale islands 60, 62, and 64. As a result of the CMP step, nanoscale islands 60, 62, and 64 have a top surface exposed. Regions of nitride 66, 68, 70, and 72 remain from nitride layer after the CMP step. An alternative etch back step to a CMP step may also be found to be effective. The desire is to expose the silicon oxide nanoscale islands while maintaining a material that is different from silicon oxide between the nanoscale islands.

Figure 10:
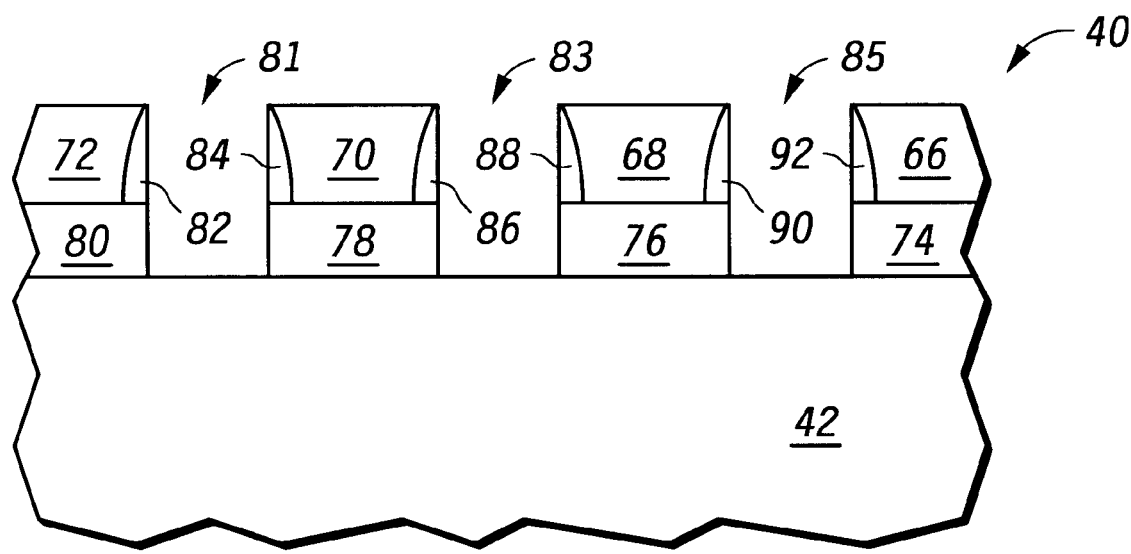

Shown in FIG. 10 is device 40 after a selective and isotropic etch of nanoscale islands 60, 62, and 64. This also removes portions of oxide layer 44 that were under nanoscale islands 60–64. The remaining structure is nitride regions 72, 70, 68, and 66 overlying oxide portions 80, 78, 76, and 74, respectively. Oxide portions 74–80 are what remain after the partial removal of oxide layer 44. There are also small portions of oxide as part of these features. These small portions of oxide are shown in FIG. 10 as portions 82, 84, 86, 88, 90, and 92. Oxide portion 82 adjoins nitride portion 72, oxide portions 84 and 86 adjoin nitride portion 70, oxide portions 88 and 90 adjoin nitride portion 68, and oxide portion 92 adjoins nitride portion 66. In this cross section shown in FIG. 10, portions 66, 68, 70, and 72 of nitride appear to be separated portions but they form part of a continuous layer of nitride that has holes in it. The nitride layer has holes in it that are in the location where nanoscale islands 60–64 were present. The result is holes 81, 83, and 85 that expose silicon substrate 42 at those locations.

Figure 11:
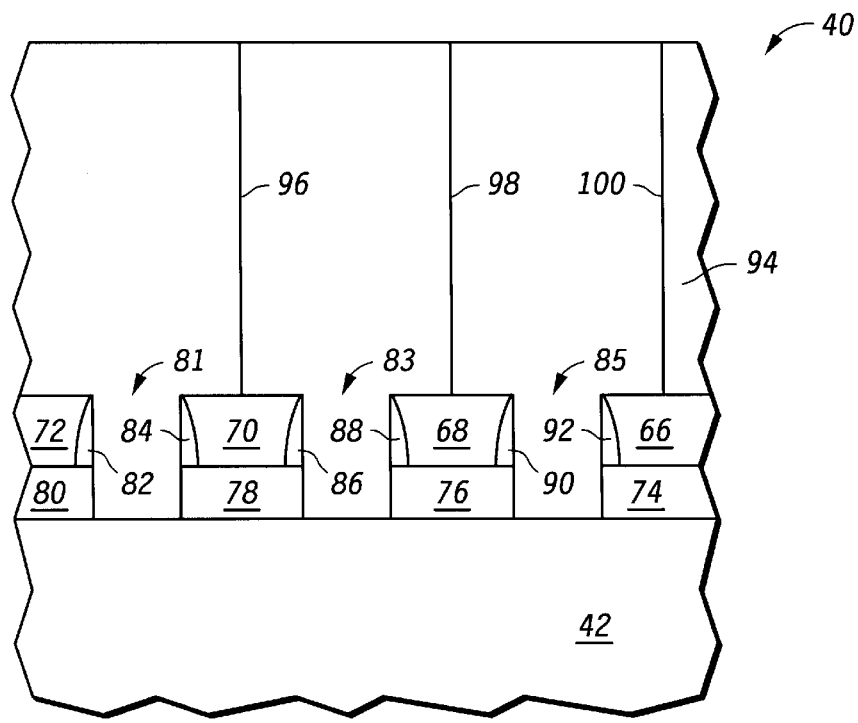

Shown in FIG. 11 is device 40 after a selective epitaxial growth of germanium to result in a germanium layer 94. Shown in FIG. 11 are grain boundaries 96, 98, and 100 that may be formed in various locations over the patterned nitride layer. These particular grain boundaries are shown as overlying nitride portion 70, nitride portion 68, and nitride portion 66.

Figure 12:
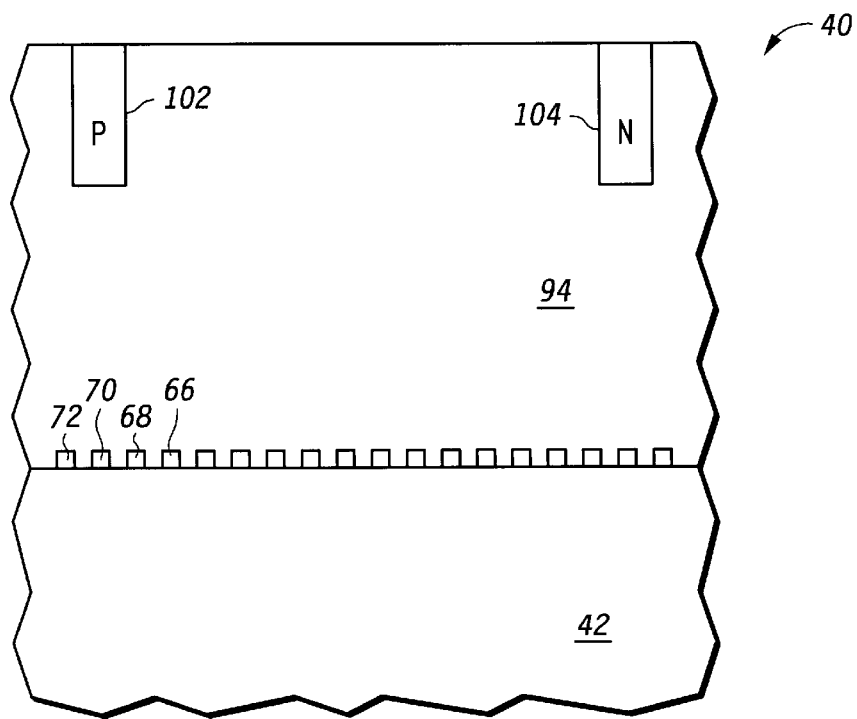
FIG. 12 is a cross section of a photo detector made according to the second embodiment of the invention.

Shown in FIG. 12 is device 40 after formation of P-type region 102 and N-type region 104 at the surface of germanium layer 94 to result in a photodetector. Device 40 in FIG. 12 shows a greater portion of an entire integrated circuit than for FIGS. 6–11. Shown in FIG. 12 are the nitride portions 66–72. Portions 82, 84, 86, 88, 90, and 92 and oxide portions 74–80 are also present but not specifically shown in FIG. 12. These portions 66–72, 74–80, and 82, 84, 86, 88, 90, and 92 are an intermediate layer between the silicon substrate 42 and the epitaxial germanium layer 94. Similar to the embodiment described for FIGS. 1–5, a pattern developed from nanocrystals is utilized to form locations in the silicon substrate from which an epitaxial growth can occur. Similarly, the formation of misfit dislocations which occur at a very low height in the growth, terminate in the areas where the nitride layer remains. Thus, for example, in FIG. 11 the misfit dislocations formed in holes 81, 83, and 85 would terminate in the regions where nitride portions 66–72 and oxide portions 74–80 and 82, 84, 86, 88, 90, and 92 are present.

Although the description has been for selective epitaxial deposition of germanium on silicon because of particular benefits of that combination, there may other alternatives as well. For example, the substrate could be gallium arsenide and the overlying layer could be indium phosphide or aluminum gallium arsenide. Also the underlying layer could be silicon with the overlying layer being gallium arsenide or indium phosphide. Similarly, the silicon nanocrystals could be an alternative material. An alternative that was selectively etchable to the underlying substrate material may not have to be converted to an oxide. In such a case, the effect is that the nanoscale islands are originally formed and not derived from nanocrystals. Also, the non-lithographic pattern of material (the nanocrystals in the embodiments of the FIGS. 1–12) may not have to be separated from the substrate by a layer such as layers 14 and 44 of FIGS. 1 and 6.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed.

What is claimed is:

1. A method for forming a semiconductor structure, comprising:

providing a silicon substrate having a first lattice constant;

forming a plurality of silicon nanocrystals overlying a portion of the silicon substrate;

oxidizing an exposed portion of the silicon substrate and the plurality of silicon nanocrystals to form a plurality of nanoscale islands;

removing the oxidized portion of the silicon substrate so as to reveal a re-exposed portion of the silicon substrate; and forming a crystalline layer overlying the plurality of nanoscale islands and the silicon substrate, wherein the crystalline layer has a second lattice constant, different from the first lattice constant.

2. The method of claim 1, wherein said forming the crystalline layer comprises:

growing the crystalline layer from the re-exposed portion of the silicon substrate.

3. The method of claim 1, wherein the crystalline layer comprises a material selected from a group consisting of germanium, gallium arsenide, and indium phosphide.

4. The method of claim 1, wherein a distance between neighboring nanoscale islands within the plurality of nanoscale islands is at most approximately 500 Angstroms.

5. The method of claim 1, wherein a width of each nanoscale island within the plurality of nanoscale islands is at most approximately 500 Angstroms.

6. The method of claim 1, wherein said forming the plurality of silicon nanocrystals is performed without using a lithographic process.

7. A method of forming a semiconductor structure, comprising:

providing a semiconductor substrate having a first lattice constant;

forming a plurality of nanoscale islands overlying a portion of the semiconductor substrate;

forming a masking layer overlying the plurality of nanoscale islands and the semiconductor substrate;

removing portions of the masking layer and a first portion of each of said nanoscale islands to expose a second portion of each of said nanoscale islands;

removing the second portion of each of said nonoscale islands to form a plurality of openings to the semiconductor substrate; and forming a crystalline layer overlying the masking layer and within the plurality of openings, wherein the crystalline layer has a second lattice constant different from the first lattice constant.

8. The method of claim 7, wherein a width of each nanoscale island within the plurality of nanoscale islands is at most approximately 500 Angstroms.

9. The method of claim 7, wherein the semiconductor substrate comprises silicon, the masking layer comprises a dielectric material, and the crystalline layer comprises a material selected from a group consisting of germanium, gallium arsenide, and indium phosphide.

10. The method of claim 7, wherein said forming the plurality of nanoscale islands is performed without using a lithographic process.

* * * * *